United States Patent
Gowda et al.

(10) Patent No.: US 10,141,251 B2
(45) Date of Patent: Nov. 27, 2018

(54) ELECTRONIC PACKAGES WITH PRE-DEFINED VIA PATTERNS AND METHODS OF MAKING AND USING THE SAME

(71) Applicant: General Electric Company, Schenectady, NY (US)

(72) Inventors: Arun Virupaksha Gowda, Rexford, NY (US); Paul Alan McConnelee, Albany, NY (US); Risto Ilkka Tuominen, Yokohama (JP)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 188 days.

(21) Appl. No.: 14/580,269

(22) Filed: Dec. 23, 2014

(65) Prior Publication Data
US 2016/0183376 A1 Jun. 23, 2016

(51) Int. Cl.
*H05K 7/00* (2006.01)
*H01L 23/498* (2006.01)
(Continued)

(52) U.S. Cl.
CPC .... *H01L 23/49827* (2013.01); *H01L 23/4985* (2013.01); *H01L 24/19* (2013.01);
(Continued)

(58) Field of Classification Search
CPC . H01L 2224/04105; H01L 2224/12105; H01L 2224/24137; H01L 2224/2919;
(Continued)

(56) References Cited

U.S. PATENT DOCUMENTS 6,377,461 B1  4/2002  Ozmat et al.
7,080,329 B1  7/2006  Teig et al.
(Continued)

FOREIGN PATENT DOCUMENTS

GB  2281814 A  3/1995

OTHER PUBLICATIONS

Fen et al., "The PCB defect inspection system design based on lab windows/CVI", Industrial Mechatronics and Automation, 2009. ICIMA 2009. International Conference on, IEEE Xplore, Abstract—2 pages, May 15-16, 2009, Conference Location: Chengdu.
(Continued)

*Primary Examiner* — Yuriy Semenenko
(74) *Attorney, Agent, or Firm* — GE Global Patent Operation; Nitin Joshi

(57) ABSTRACT

An electronic package is provided. The electronic package includes a substrate and a plurality of vias defined by a corresponding plurality of pre-defined via patterns. The electronic package further a metal built-up layer disposed on portions of the substrate to provide a plurality of pre-defined via locations and the plurality of pre-defined via patterns of the plurality of vias. Also, the electronic package includes a first conductive layer disposed on at least a portion of the metal built-up layer. Moreover, the electronic package includes a second conductive layer disposed on the first conductive layer, where the plurality of vias is disposed at least in part in the metal built-up layer, the first conductive layer, and the second conductive layer.

12 Claims, 15 Drawing Sheets

(51) Int. Cl.
*H01L 23/00* (2006.01)
*H01L 21/66* (2006.01)

(52) U.S. Cl.
CPC .............. *H01L 22/12* (2013.01); *H01L 22/14* (2013.01); *H01L 23/49838* (2013.01); *H01L 2224/04105* (2013.01); *H01L 2224/12105* (2013.01); *H01L 2224/24137* (2013.01); *H01L 2224/2919* (2013.01); *H01L 2224/32225* (2013.01); *H01L 2224/83127* (2013.01); *H01L 2224/83192* (2013.01); *H01L 2224/92144* (2013.01); *H01L 2924/19105* (2013.01); *H01L 2924/37001* (2013.01)

(58) Field of Classification Search
CPC . H01L 2224/32225; H01L 2224/83127; H01L 2224/83192; H01L 2224/92144; H01L 22/12; H01L 24/19; H01L 2924/19105; H01L 2924/37
See application file for complete search history.

(56) References Cited

U.S. PATENT DOCUMENTS

| | | | |
|---|---|---|---|
| 7,786,562 B2 | 8/2010 | Ozguz et al. | |
| 8,114,712 B1* | 2/2012 | McConnelee | H01L 21/486 257/E21.499 |
| 8,427,652 B2 | 4/2013 | Bendix et al. | |
| 8,653,670 B2 | 2/2014 | McConnelee et al. | |
| 8,716,870 B2 | 5/2014 | Gowda | |
| 2005/0190959 A1 | 9/2005 | Kohler et al. | |
| 2007/0039754 A1* | 2/2007 | Salama | H05K 3/185 174/262 |
| 2007/0235810 A1* | 10/2007 | Delgado | H01L 23/5389 257/356 |
| 2008/0190748 A1* | 8/2008 | Arthur | H01H 59/0009 200/181 |
| 2008/0196930 A1 | 8/2008 | Tuominen et al. | |
| 2011/0084386 A1* | 4/2011 | Pendse | H01L 23/3178 257/737 |
| 2012/0273926 A1* | 11/2012 | Pagaila | H01L 23/552 257/659 |
| 2013/0126493 A1* | 5/2013 | Bedell | B23K 26/364 219/121.85 |
| 2014/0059851 A1* | 3/2014 | Tuominen | H01L 21/4846 29/832 |

OTHER PUBLICATIONS

Fisher, R. et al., "High frequency, low cost, power packaging using thin film power overlay technology", Applied Power Electronics Conference and Exposition, 1995. APEC '95. Conference Proceedings 1995., Tenth Annual, IEEE Xplore, vol. 1, Abstract—2 pages, Mar. 5-9, 1995, Conference Location: Dallas, TX.

European Search Report and Opinion issued in connection with corresponding EP Application No. 15198634.6 dated Jun. 2, 2016.

* cited by examiner

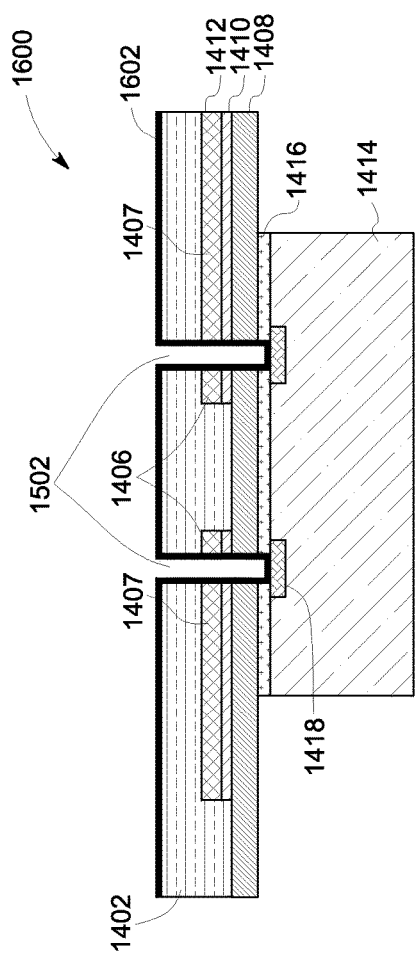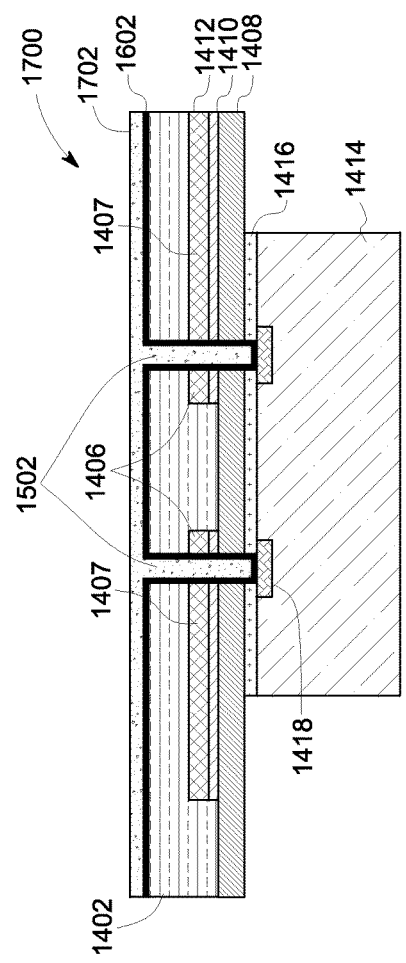

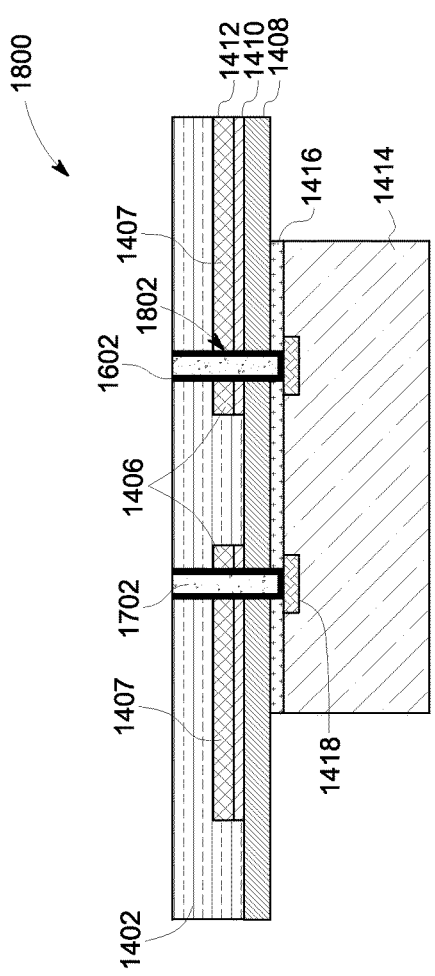
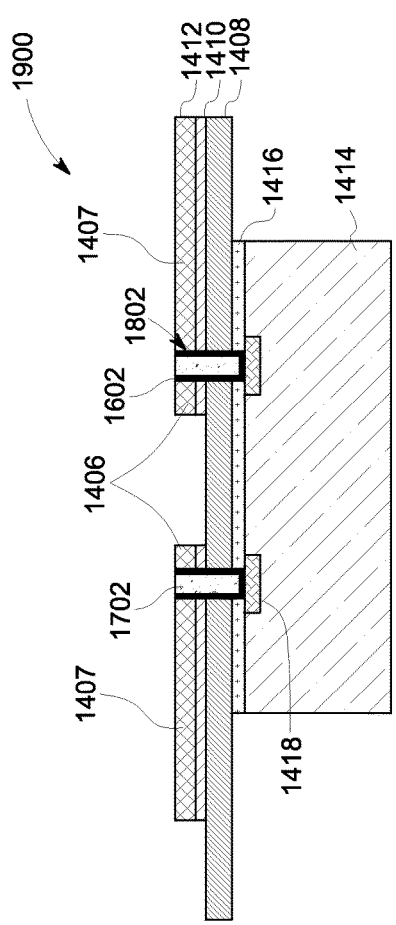

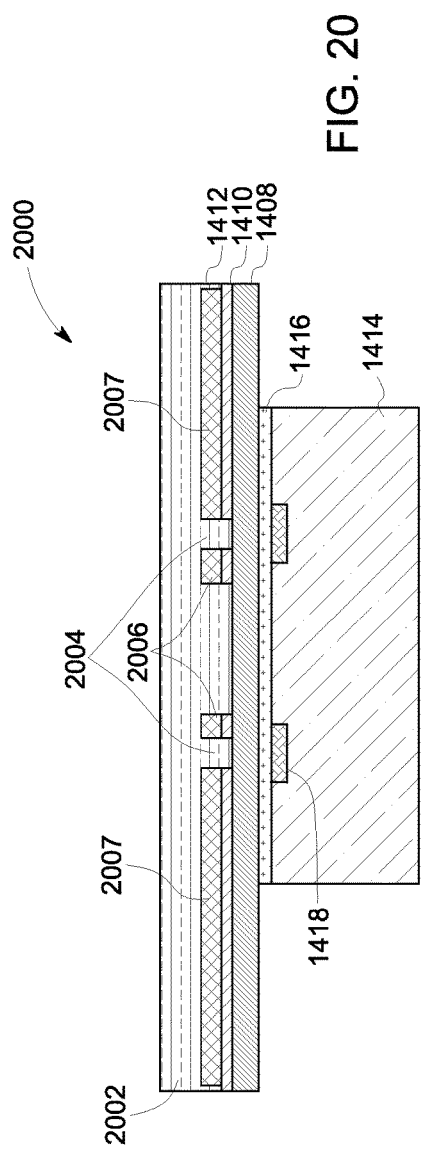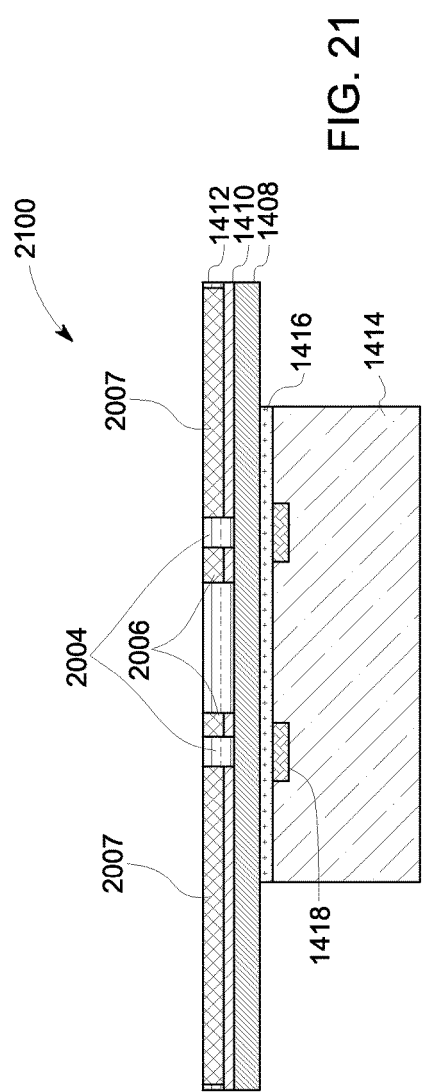

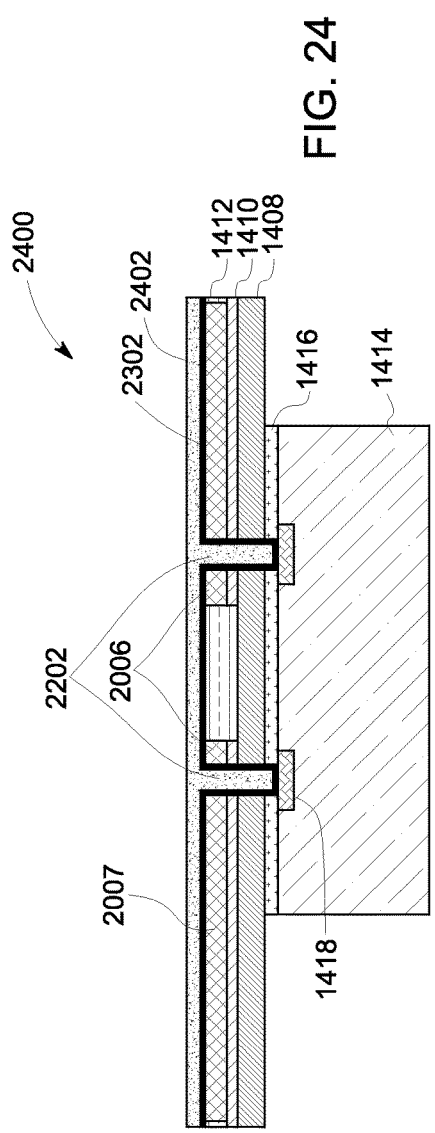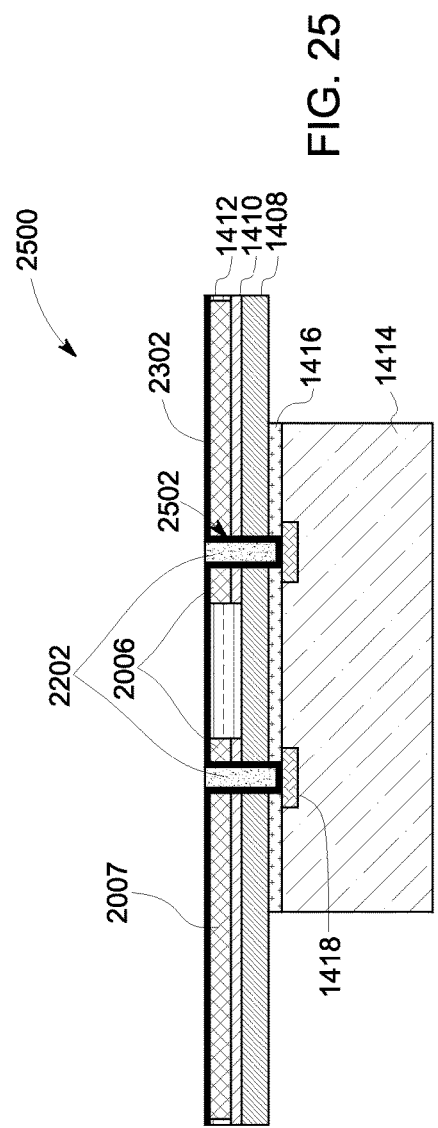

ELECTRONIC PACKAGES WITH PRE-DEFINED VIA PATTERNS AND METHODS OF MAKING AND USING THE SAME

BACKGROUND

Embodiments of the present specification relate to electronic packages, and more particularly to electronic packages having pre-defined via patterns.

Technological advancements in the area of electronic devices have experienced vast growth in recent years. For example, while cellular phones are becoming smaller and lighter, their features and capabilities are simultaneously expanding. This has caused an increase in the complexity and operation of the electrical components found in such devices and a decrease in the amount of space available for such components. Several challenges arise from such an increase in the complexity of the electrical components and decrease in the amount of space available. For example, based on space limitations, circuit boards are reduced in size to an extent that the routing density for the board may be constrained and limited below a desired amount. As integrated circuits (ICs) become increasingly smaller and yield better operating performance, packaging technology for integrated circuit (IC) packaging has correspondingly evolved from leaded packaging to laminate-based ball grid array (BGA) packaging and eventually to chip scale packaging (CSP). Advancements in IC chip packaging technology are driven by ever-increasing needs for achieving better performance, greater miniaturization, and higher reliability. New packaging technology has to further provide for the possibilities of batch production for the purpose of large-scale manufacturing thereby allowing economy of scale.

Furthermore, due to the small size and complexity of IC packages, the process for fabricating the IC packages is typically expensive and time consuming. Also, use of additional re-distribution layers to create desired double-sided input/output (I/O) systems increases the number of processing steps, further increasing the cost and complexity of the manufacturing process. Moreover, increasing I/O per device increases routing density and number of vias that are required per device.

BRIEF DESCRIPTION

In accordance with aspects of the present specification, an electronic package is presented. The electronic package includes a substrate and a plurality of vias defined by a corresponding plurality of pre-defined via patterns. The electronic package further includes a metal built-up layer disposed on portions of the substrate to provide a plurality of pre-defined via locations and the plurality of pre-defined via patterns of the plurality of vias. Further, the electronic package includes a first conductive layer disposed on at least a portion of the metal built-up layer. Moreover, the electronic package includes a second conductive layer disposed on the first conductive layer, where the plurality of vias is disposed at least in part in the metal built-up layer, the first conductive layer, and the second conductive layer.

In accordance with another aspect of the present specification, an electronic assembly is presented. The electronic assembly includes an electronic package having a substrate and a plurality of vias defined by a corresponding plurality of pre-defined via patterns. Further, the electronic package includes a metal built-up layer disposed on portions of the substrate to provide a plurality of pre-defined via locations and the plurality of pre-defined via patterns of the plurality of vias. Moreover, the electronic package includes a first conductive layer disposed on at least a portion of the metal built-up layer and a second conductive layer disposed on the first conductive layer, where the plurality of vias is disposed at least in part in the metal built-up layer, the first conductive layer, and the second conductive layer. The electronic assembly also includes an electronic device coupled to corresponding vias of the plurality of vias.

In accordance with yet another aspect of the present specification, a method of making an electronic package is presented. The method includes providing a substrate having a first side and a second side and disposing a metal built-up layer on the first side of the substrate to provide pre-defined via locations and pre-defined via patterns. The method further includes coupling an electronic device to the second side of the substrate such that contact pads on the electronic device are aligned with one or more pre-defined via locations. Moreover, the method includes selectively removing portions of the substrate at the one or more pre-defined via locations. The method also includes providing a first conductive layer disposed on at least a portion of the metal built-up layer and providing a second conductive layer disposed on at least a portion of the first conductive layer. Further, the pre-defined via patterns correspond to a plurality of vias that is disposed at least in part in the metal built-up layer, the first conductive layer and the second conductive layer.

DRAWINGS

These and other features, aspects, and advantages of the present disclosure will become better understood when the following detailed description is read with reference to the accompanying drawings in which like characters represent like parts throughout the drawings, wherein.

Figure 9:
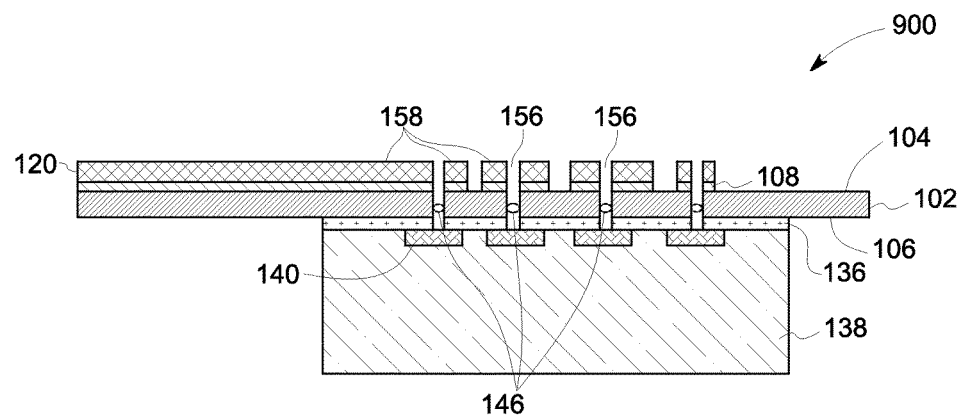
Figure 10:
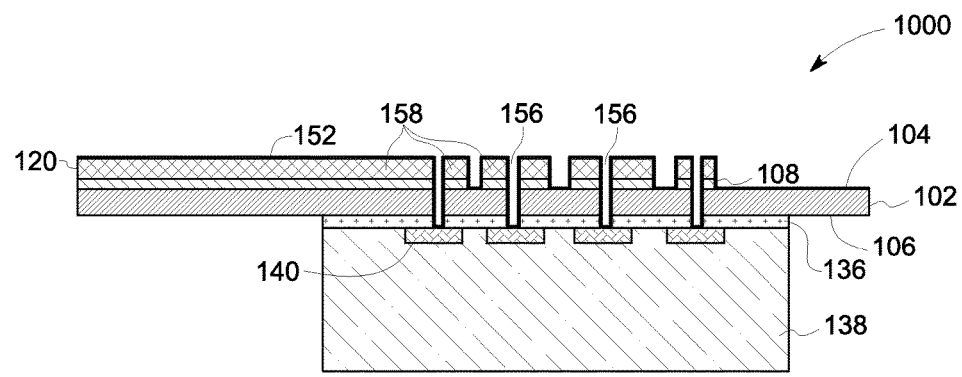
Figure 11:
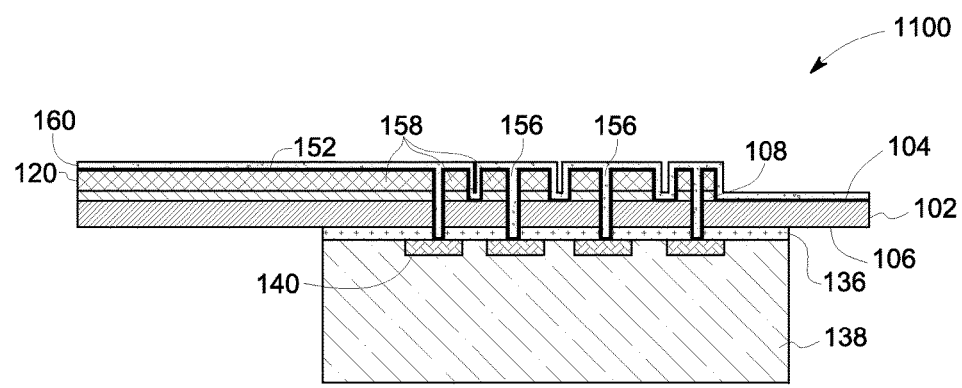

FIGS. 14-19 and 20-25 are schematic representations of exemplary alternative steps for steps illustrated in FIGS. 9-11, in accordance with aspects of the present specification; and FIGS. 26-38 are schematic representations of another exemplary method of making an electronic assembly having pre-defined via locations, pre-defined via patterns, and pre-defined trace patterns, in accordance with aspects of the present specification.

DETAILED DESCRIPTION

Embodiments of the present specification relate to electronic packages having pre-defined via locations and pre-defined via patterns. Additionally, the electronic packages may also include pre-defined trace patterns. In one embodiment, an electronic device may be coupled to the pre-defined via patterns at the pre-defined via locations of the electronic package to form an electronic assembly. It may be noted that each via pattern is configured to define a corresponding via. In particular, each via pattern surrounds the corresponding via location. Further, the pre-defined via locations, the pre-defined via patterns, and the pre-defined trace patterns may be inspected prior to operatively coupling the electronic device to the electronic package to identify a patterning defects, plating anomalies, and other yield impacting issues, and to determine whether a successful via connection between the device and the via pattern may be obtained. The term "pre-defined" may be used to refer to a state of an element of the electronic package where the element is formed before coupling the electronic device to the electronic package. Accordingly, the terms "pre-defined via patterns" and "pre-defined trace patterns" refer to the via and trace patterns that are formed prior to coupling the electronic device to the electronic package.

Advantageously, the method of the present specification allows the provision for the via locations to be pre-formed prior to coupling the electronic device to the electronic package, thereby facilitating identification of the condition of the via location and the via pattern and determining whether the via pattern is suitable to be coupled to the electronic device. In particular, in certain embodiments, the electronic package of the present specification provides the benefit of defining the via locations and forming the via patterns prior to coupling the electronic package to the electronic device. It may be noted that pre-defining the via patterns and the trace patterns allows defective via patterns and/or trace patterns to be identified and excluded from being coupled to one or more electronic devices, such as semiconductor dies. For example, defining the via locations and the via patterns before coupling the electronic device to the electronic package provides the opportunity to segregate via locations that may result in functional vias from via locations that may result in faulty vias. As will be appreciated, with the increase in cost and complexity of electronic devices (for example, semiconductor dies), such as application specific integrated circuit (ASIC) chips, there is a corresponding increase in the cost of designing, qualifying and fabricating packaging for these devices. In one example, if a particular via location, a via pattern and/or a trace pattern is identified as being defective, or that may result in a defective via, the electronic device may not be coupled to that particular via location. Further, the electronic device may not be coupled to a cluster of via locations that may include the particular via location that is likely to result in the defective via. Moreover, the vias and/or via patterns may be tested using visual inspection, or automated methods using automatic test equipment and probers, as well known to those of skill in the art. In some embodiments, once the defective or faulty via locations, via patterns, and/or trace patterns are identified, the identified vias may not be coupled to the electronic device, thereby saving the expensive electronic devices from becoming inoperable due to virtue of them being connected to a faulty via. Accordingly, coupling the electronic device to the faulty vias is prevented, and yield of the electronic package is increased by enhancing the chances of the electronic devices coupled to the electronic package being functional by virtue of the electronic devices being coupled to the functional vias and not the faulty vias.

FIGS. 1-12 are schematic diagrams of steps of a method of making an electronic package having pre-defined via locations and pre-defined via patterns. In addition, the method of the present specification also provides provisions to form pre-defined trace patterns. As illustrated in the schematic representation 100 of FIG. 1, the fabrication process may commence by providing a substrate 102, such as a layer of polyimide. The substrate 102 may include a first side 104 and a second side 106.

Further, in some embodiments, the substrate 102 may be made of glass, ceramic, or a polymeric material. In one example, the polymeric material may be a flexible material.

In one embodiment, the substrate 102 may be made of a dielectric material, such as, but not limited to, polyimide or polyimide-based materials. In a particular example, the substrate 102 may be made of Kapton®. In certain embodiments, the substrate 102 may have a thickness from about 12 microns to about 50 microns, for example. In one embodiment, the substrate 102 may be disposed on a processing frame (not shown). Further, the processing frame may be made of a rigid material, such as, aluminum, copper, ceramic-metal composite, nickel, silver, stainless steel, printed circuit board (PCB) core, fiber glass reinforced epoxy, or another suitable material, or combinations thereof. In one example, the processing frame may be made of stainless steel. Also, the processing frame may or may not form part of the resultant circuit or the electronic package.

Figure 1:
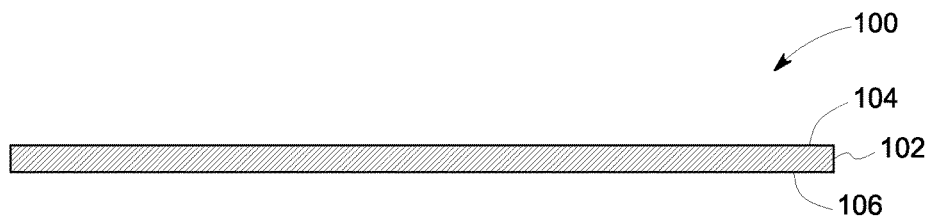
FIGS. 1-12 are schematic representations of steps involved in an exemplary method of making an electronic assembly having pre-defined via patterns, in accordance with aspects of the present specification.
Figure 2:
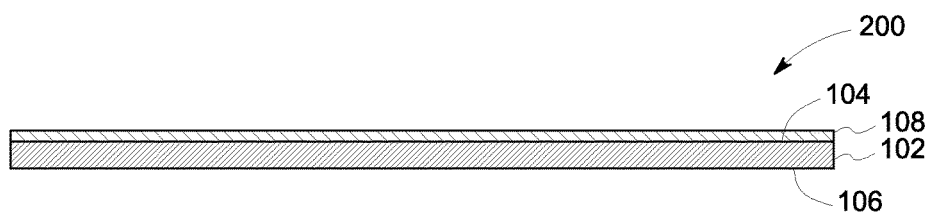

Moreover, as illustrated in the schematic representation 200 of FIG. 2, a layer 108 of a seed metal may be deposited on at least a portion of the first side 104 of the substrate 102. In certain embodiments, the seed metal layer 108 may be deposited on the substrate 102 by employing techniques, such as, but not limited to, coating, sputtering, spraying, evaporation, vapor deposition, dip coating, lamination, or combinations thereof. In some embodiments, the substrate 102 having the seed metal layer 108 pre-deposited on the first side 104 of the substrate 102 may be provided as a first step for making an electronic package, such as an electronic package of an electronic assembly 1200 (see FIG. 12(*a*)). It may be noted that primarily the electronic package refers to structure of the electronic assembly 1200 having components other than an electronic device, such as an electronic device 138. In one example, the seed metal of the seed metal layer may include titanium, tantalum, titanium-tungsten, copper, nickel, chrome, or combinations thereof. In one embodiment, a thickness of the seed metal layer 108 may be in a range from about 10 nanometers to about 25 microns.

Next, as illustrated in the schematic representation 300 of FIG. 3(*a*) and as illustrated in FIG. 3(*b*) as a top view 122 of the schematic representation 300, a patterned mask, such as a patterned resist layer 116, may be applied on the seed metal layer 108 to define a plurality of via locations 110, a plurality of pre-defined via patterns 112, and a plurality of pre-defined trace patterns 114.

It may be noted that in alternative embodiments, the patterned resist layer 116 may be formed using a blanket resist layer. In these embodiments, the blanket resist layer may be disposed on the seed metal layer 108. Further, this blanket resist layer may be patterned to define the plurality of via locations 110, the plurality of pre-defined via patterns 112, and the plurality of pre-defined trace patterns 114. In one embodiment, the blanket resist layer may be deposited by employing lamination, dip coating, or other known deposition methods, and patterning the blanket resist layer to form the desirable patterns. In some embodiments, a resist material may be available as a film or a liquid that may be patterned post deposition using known patterning methods, such as, but not limited to, laser direct imaging, stepper, or the like.

In certain embodiments, the patterned resist layer 116 may include patterns 118 and 119 that will eventually define the via locations 110, size of the vias, the via patterns 112, and the trace patterns 114 in the resultant electronic assembly 1200 (see FIG. 12(*a*)). In one embodiment, the patterned resist layer 116 may be configured to act as a photoresist mask during photolithography to translate the patterns 118 of the patterned resist layer 116 to the seed metal layer 108.

Figure 3A:
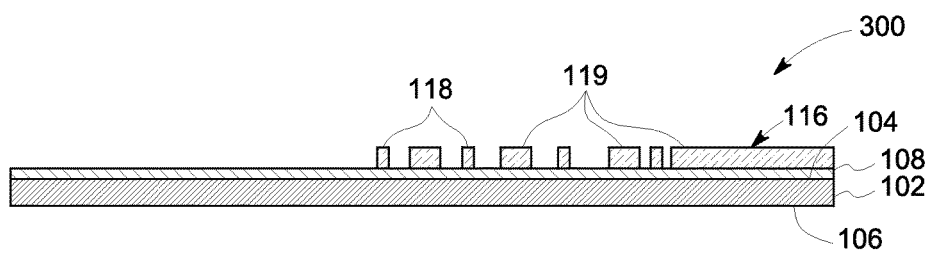
Figure 3B:
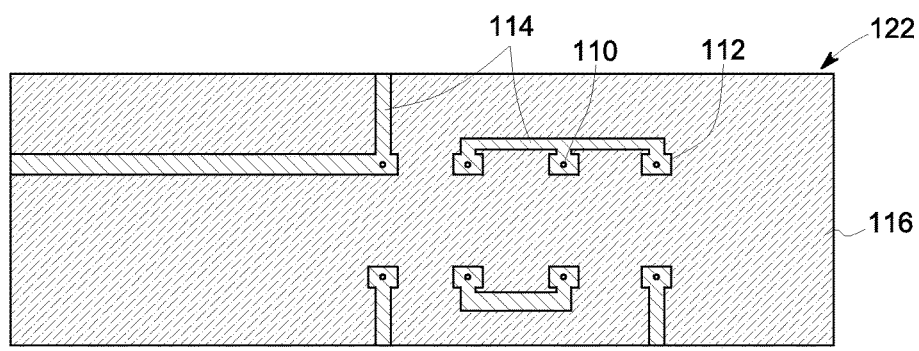
Figure 4:
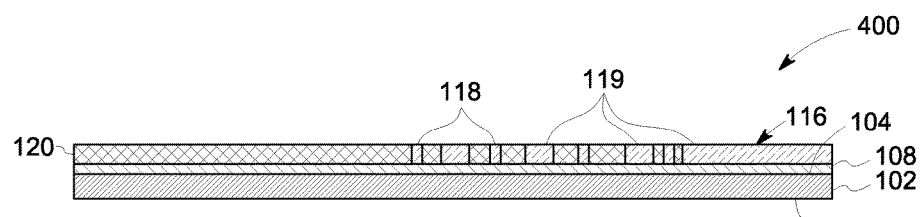

Further, as illustrated in the schematic representation 400 of FIG. 4, a metal built-up layer 120 may be deposited at least in portions of the seed metal layer 108 corresponding to the via patterns 112 (see FIG. 3(b)) and the trace patterns 114 (see FIG. 3(b)). In a non-limiting example, the metal built-up layer 120 may be made of copper.

In a non-limiting example, an average diameter of the plurality of vias may be in a range from about 1 micron to about 500 microns. However, vias larger than 500 microns are also envisioned within the scope of the present specification. In same or different example, an average pitch between two adjacently disposed vias may be in a range from about 2 microns to about 1000 microns. Further, an average width of the plurality of pre-defined trace patterns 114 may be in a range from about 1 micron to about 500 microns.

Figure 5:
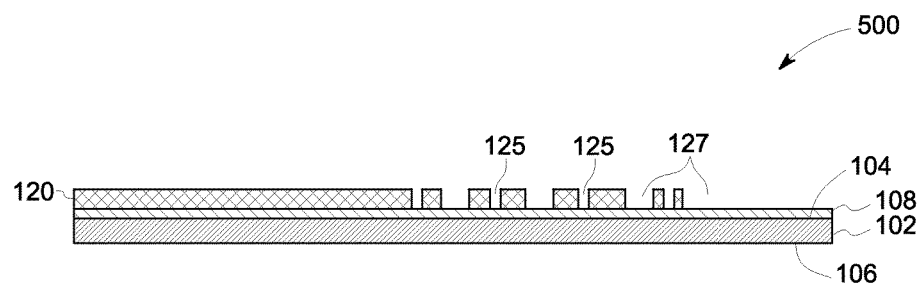

Also, as represented in the schematic representation 500 of FIG. 5, after deposition of the metal built-up layer 120, the patterned resist layer 116 may be removed to expose portions of the seed metal layer 108 underlying the patterns 118 and to form portions 125 and 127 of the via locations 110, via patterns 112, and the trace patterns 114 (see FIG. 3(b)). In one example, the patterned resist layer 116 may be removed using dry etch, wet etch, stripping, laser ablation, or combinations thereof.

Figure 6A:
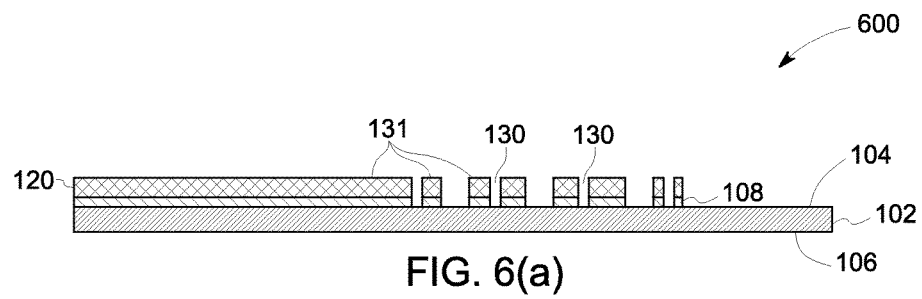
Figure 6B:
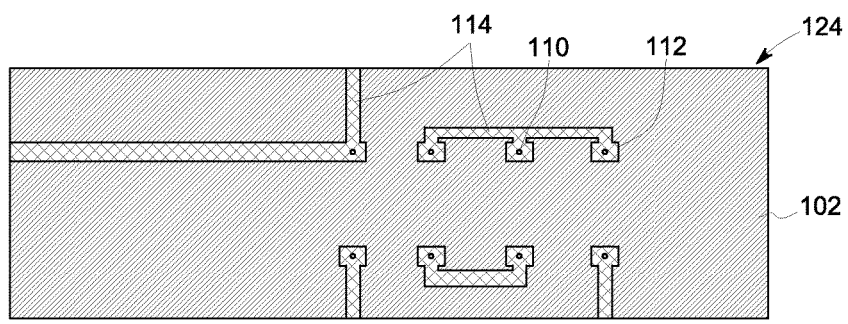

Next, as illustrated in the schematic representation 600 of FIG. 6(a) and as illustrated in a top view 124 in FIG. 6(b), where the top view 124 is top view of the schematic representation 600, the seed metal layer 108 may be at least partly removed from portions of the first side 104 of the substrate 102 to define at least a portion 130 of the via locations 110 (see FIG. 3(b)) and pre-defined via and trace patterns 131. In particular, the seed metal layer 108 may be removed from the portions of the first side 104 of the substrate 102 that correspond to the via locations 110.

Figure 7:
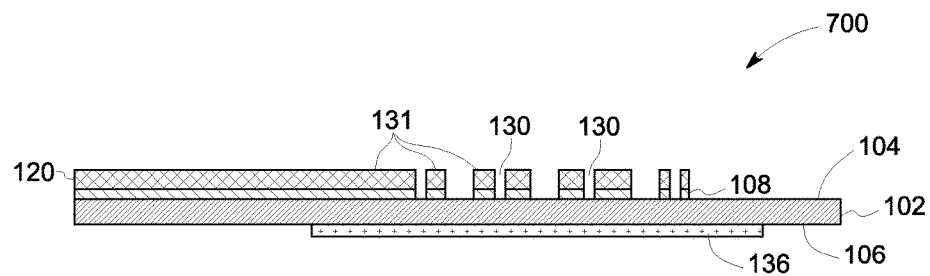

Further, as illustrated in the schematic representation 700 of FIG. 7, a layer 136 of an adhesive may be applied on the second side 106 of the substrate 102. The adhesive may be a non-conductive adhesive, such as an epoxy based adhesive. In certain embodiments, the adhesive layer 136 may be configured for B-staging to facilitate efficient fabrication of the electronic assembly 1200 (see FIG. 12(a)).

Figure 8A:
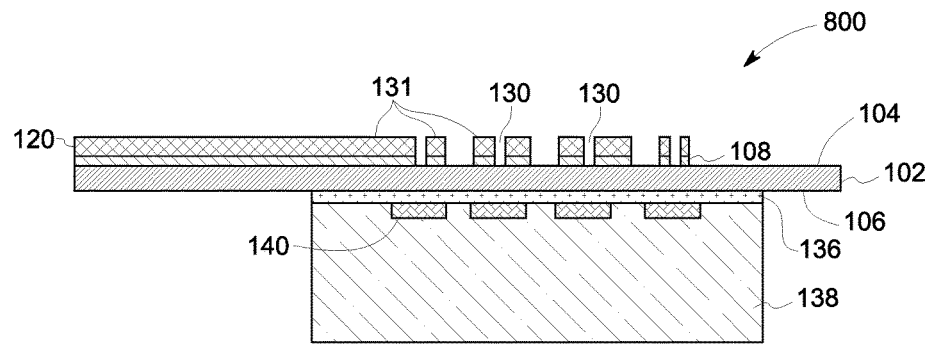
Figure 8B:
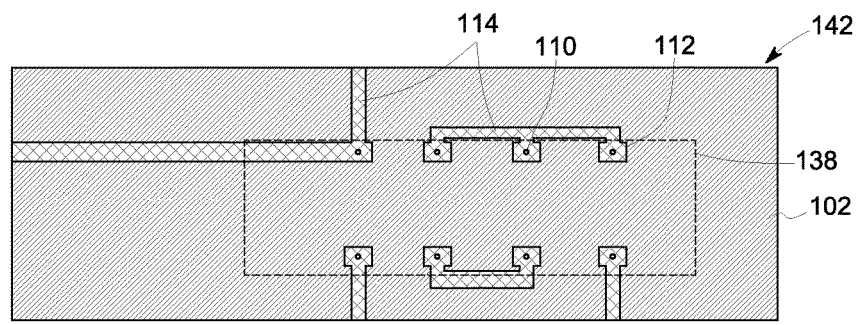

Next, as illustrated in the schematic representation 800 of FIG. 8(a) and a top view 142 of FIG. 8(b), a desirable electronic device 138, such as a semiconductor die, may be coupled to the substrate 102 via the adhesive layer 136. Reference numeral 142 represent a top view of the schematic representation 800 illustrating relative positioning of the electronic device 138 with respect to the pre-defined via locations 130 and the pre-defined via and trace patterns 131. In particular, the electronic device 138 may be aligned with respect to the pre-defined via locations 130 and the pre-defined via and trace patterns 131 such that contact pads 140 or any other desirable electrical connections on the electronic device 138 are operatively coupled to the pre-defined via locations 130 and/or the pre-defined via and trace patterns 131. It may be noted that the pre-defined via and trace patterns 131 may be inspected to identify faulty via locations or patterns. In case one or more faulty via locations or patterns are identified, the electronic device 138 may not be coupled to such faulty via locations or patterns.

In some embodiments, the electronic device 138 may be a semiconductor die. However, it is envisioned that other electronic components other than the semiconductor die, such as active or passive electronic devices, may also be attached to the substrate 102. Further, although, FIGS. 1-12 are explained with respect to a single electronic device, however, methods of the present specification may also be used to couple a plurality of electronic devices, including an array of dies, where one or more dies of the array of dies may be coupled to respective vias in an electronic package. Accordingly, although not illustrated, it is contemplated that a plurality of such electronic devices may be attached to the substrate 102 such that a multi-component module or layer may be formed. Further, in embodiments where the plurality of electronic devices is employed, contact pads of the electronic devices may be aligned to vias 126 (see FIGS. 12(a) and 12(b)).

As illustrated in the schematic representation 900 of FIG. 9, portions 146 of the substrate 102 and the adhesive layer 136 may be removed to extend the pre-defined via locations 130 till the electronic device 138. The extended pre-defined via locations are represented by reference numeral 156 and the extended pre-defined via and trace patterns are represented by reference numeral 158. In one embodiment, removing the portions 146 of the substrate 102 may include dry etching, wet etching, ablation, dissolving, drilling, laser ablation, or combinations thereof. In one example, the portions 146 of the substrate 102 may be selectively removed using one or more of $CO_2$ laser, plasma etch, ultraviolet laser, or combinations thereof. Further, in case of laser ablation of the substrate 102 and the adhesive layer 136, laser beams (not shown in FIG. 9) may be used to remove determined portions of the substrate 102 to form the pre-defined via locations 156 and the pre-defined via and trace patterns 158. It may be noted that the size of the vias may be defined by the patterns 146. In one embodiment, the laser beams may include UV laser beams. In an exemplary embodiment, a size of the laser beams may be greater than or equal to a size of the vias that are to be formed in the substrate 102. In embodiments where the size of the laser beams is larger than the size of the vias, presence of the metal built-up layer 120 allows only a portion of the laser beams corresponding to the size desirable for the vias to be incident on the substrate 102. In one embodiment, a thickness of the metal built-up layer 120 may be such that the metal built-up layer 120 is configured to withstand energy of the laser beams without undergoing undesirable disintegration. In one embodiment, the plurality of vias may include blind vias, through vias, or a combination thereof. In one example where the vias are blind vias, the blind vias are configured to provide electrical connections between the electronic device 138 and an electronic components, such as a chip, where the electronic device 138 and the chip are coupled using the electronic assembly 1200 (see FIG. 12(a)). In certain embodiments, the through hole vias or through vias may be formed to connect the via and trace patterns formed on the first side 104 of the substrate 102 to metal patterns formed on the second side 106 of the substrate 102. Further, metal patterns on the second side 106 of the substrate 102 may be formed via similar techniques employed to form the metal built-up layer and before coupling the electronic device 138 to the substrate 102. These metal patterns may also be inspected in addition to the patterns on the first side 104 of the substrate 102 before coupling the electronic device 138 to the desirable location. It may be noted that there may not be any via locations on the second side 106 of the substrate 102. By way of example, the second side 106 of the substrate 102 may have one or more copper pads that may be configured to act as the contact pad 140 of the electronic device 138. Further, the vias may be formed in the same fashion to this metal pattern as they may be formed to the contact pads 140 of the electronic device 138.

Further, as illustrated in the schematic representation 1000 of FIG. 10, a first conductive layer 152 may be disposed on at least portions of the pre-defined via locations 156 and pre-defined via and trace 158 to provide metallization to the via locations 156 and the via and trace patterns 158. In one embodiment, the metallization may be performed using sputtering. In this embodiment, the metallization may include depositing the first conductive layer 152 using sputtering. In particular, sputtering may result in the region corresponding to the vias 110 (see FIG. 3(a)) being at least partly filled with the material of the first conductive layer 152 to define a location of a via. Further, the metallization process may be performed using evaporation, electro-less or electrolytic plating. In one example, the first conductive layer 152 may include titanium, copper, or both and may act as a seed layer for a subsequent layer. Other non-limiting examples of the material for the first conductive layer 152 may include copper, titanium, titanium-tungsten, chrome, gold, silver, nickel, or combinations thereof. In one example, the first conductive layer 152 may be configured to act as a seed layer to facilitate deposition of subsequent one or more conductive layers.

Next, as illustrated in the schematic representation 1100 of FIG. 11, a second conductive layer 160 may be deposited on the first conductive layer 152. In one example, the second conductive layer 160 may be electroplated using the first conductive layer 152 that acts as the seed layer for electroplating of the second conductive layer 160. In one embodiment, the second conductive layer 160 may be deposited in the via locations 156 (see FIG. 10) using semi-additive plating or preferential deposition to ensure that the material of the second conductive layer 160 remains in the via locations after an etch is performed to remove portions of the first and second conductive layers 152 and 160 preferably from areas disposed outside the vias 126 (see FIG. 12(a)). In one embodiment, the second conductive layer 160 may include a single layer or a combination of layers. Non-limiting examples of the material for the second conductive layer 160 may include copper, titanium, titanium-tungsten, chrome, copper, gold, silver, nickel, aluminum, or combinations thereof. Further, it is also envisioned that composite materials may be used to form the second conductive layer 160. In some embodiments, a metal impregnated epoxy or metal-filled paint may be used as the second conductive layer 160. In some other embodiments, the second conductive layer 160 may be deposited using semi-additive plating, sputtering, electroplating, electro-less plating, or combinations thereof. It may be noted that the material of the seed metal layer 108, the metal built-up layer 120, the first conductive layer 152, and the second conductive layer 160 may have same or different composition.

Figure 12A:
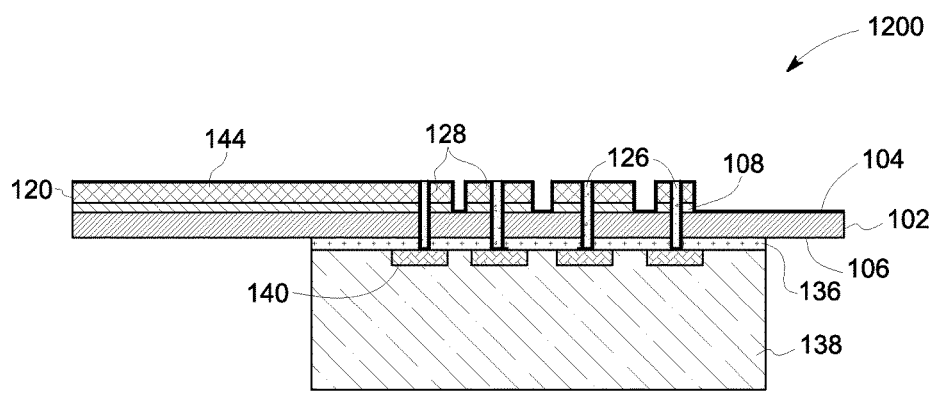
Figure 12B:
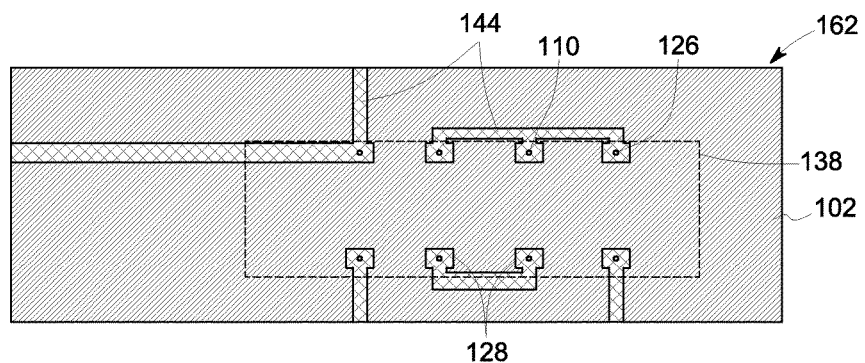

Turning now to FIGS. 12(a) and 12(b), a schematic representation 1200 and a top view 162 of the electronic assembly 1200 are respectively illustrated in FIGS. 12(a) and 12(b). The vias 126, the via patterns 128, and trace patterns 144 may be formed by selectively removing portions of the first and second conductive layers 152 and 160. In particular, portions of the first and second conductive layers 152 and 160 disposed outside the vias 126 may be removed.

Further, one or more cleaning steps may be introduced after any step that entails removing at least a portion of one or more layers of the electronic assembly 1200. By way of example, a cleaning step may be performed after the step represented by FIG. 4, where the patterned resist layer 116 is removed. Similarly, a cleaning step or etch step may be performed at least after the steps represented in FIGS. 6(a), 9 and 12(a) are performed. Such cleaning steps may be performed to remove any excess material from stack of layers that are configured to form the electronic assembly 1200. It may be noted that additional cleaning steps may also be performed. By way of example, a cleaning step may be performed to clean at least a portion of a surface of the inside of the via patterns 156 prior to depositing the first conductive layer 152. In some embodiments, an optional step of cleaning the seed metal layer 108 may be employed before disposing the second conductive layer 160. In one example, the cleaning step may be used to remove any undesirable material, such as oxides, metals, dielectrics, contaminants, particles, adhesives from surfaces of one or more layers of the electronic assembly and to facilitate enhanced adherence between adjacently disposed layers.

In certain embodiments, the method for making the electronic assembly 1200 may be further progressed by encapsulating the electronic device 138 for example, to provide environmental protection. The method may also include adding surface finishes, solder masks, and/or solder balls. Moreover, the electronic assembly 1200 may be mounted on an electronic board (for example, a printed circuit board (PCB) using soldering, adhesive attach, ball grid array, flip-chip assembly, wire bonding, or any other known coupling techniques, or combinations thereof.

In another example, for low-cost, relatively high I/O density in the semiconductor die or the electronic assembly 1200, flip-chip technology may be used to electrically couple the electronic assembly 1200 to the electronic board. Further, in some embodiments, metal bumps, studs, or balls of metals (collectively referred to herein as "bump-type" interconnections) may be applied, for example, in a two dimensional array pattern, directly to an active surface of the electronic assembly 900, where the active surface may include the vias 126, via patterns 128, and/or trace patterns 144. Alternatively, in one embodiment, an electrically conductive adhesive may be used to couple the electronic assembly 1200 to an electronic circuit.

Further, it may be noted that the electronic assembly may include two or more electronic devices, such as, but not limited to, a semiconductor die, a diode, integrated circuit (IC), capacitors, resistors, or other electronic devices. Moreover, the electronic package may be a surface-mount package, where the electronic devices are packaged within a sub-module that forms a direct metallic connection to external devices. In one embodiment, the plurality of electronic devices of the electronic package may be arranged in an array configuration. Further, the plurality of electronic devices may be aligned relative to the locations of the vias using a pick and place robotic device and one or more fiducial reference points. In addition, in some embodiments, the method may also be used for making a plurality of electronic packages per processing frame. In these embodiments, each electronic package may have one or more electronic devices.

Figure 13:
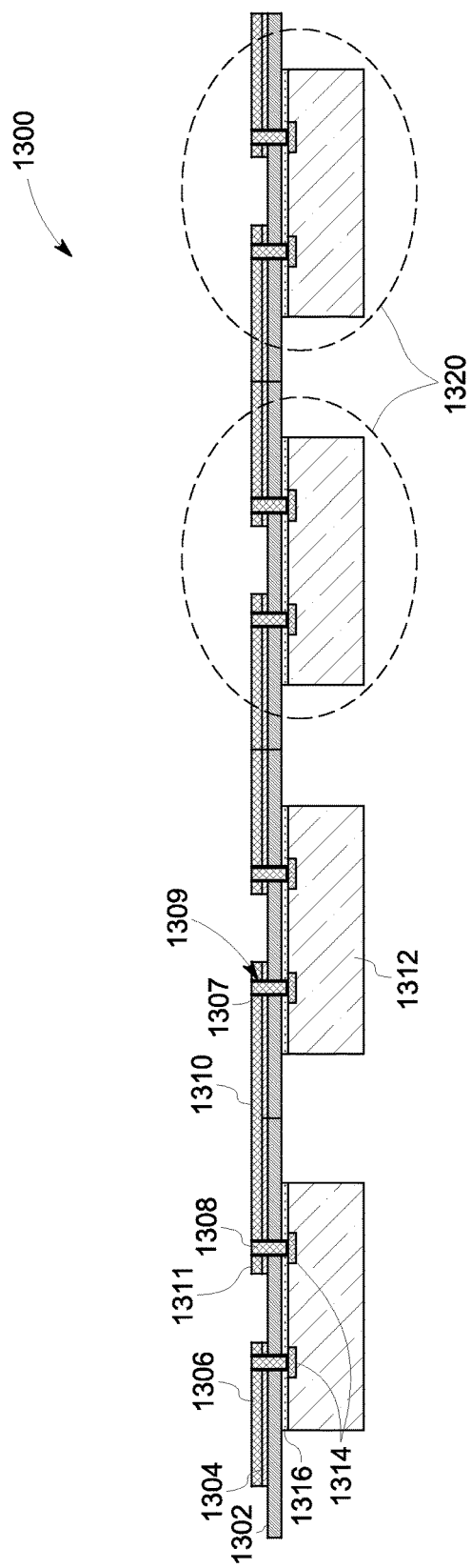
FIG. 13 is a cross-sectional side view of an electronic package fabricated using the method represented in FIGS. 1-12, in accordance with aspects of the present specification.

FIG. 13 represents an exemplary electronic assembly 1300 having a substrate 1302 along with a seed metal layer 1304, a metal built-up layer 1306, a first conductive layer 1307 and a second conductive layer 1308. The electronic assembly 1300 further includes a plurality of vias 1309 defined by a corresponding plurality of pre-defined via patterns 1311 and a plurality of pre-defined trace patterns 1310. One or more vias 1309 of the plurality of the vias 1309 may be in electrical communication with a plurality of electronic devices, for example, semiconductor dies 1312. The plurality of semiconductor dies 1312 is coupled to the substrate 1302 using contact pads 1314 and an adhesive layer 1316. Further, the plurality of semiconductor dies 1312 is arranged on the substrate 1302 such that electrical connections, such as the contact pads 1314, on each of the semiconductor dies 1312 are aligned with a corresponding via location of the plurality of vias 1308. Moreover, the plurality of via locations, the plurality of via and trace patterns 1311 and 1310 may be inspected prior to attaching the semiconductor dies 1312 to the substrate 1302. Further, the semiconductor dies 1312 may not be coupled to the via locations that may be identified as faulty vias. In some embodiments, the first and second conductive layers 1307 and 1308 together form a routing interconnect for the electronic assembly 1300, where the routing interconnect is configured to provide electrical communication amongst the electronic assembly 1300 having a plurality of electronic packages 1320. Advantageously, in addition to providing pre-defined via and trace patterns, the electronic package of the present specification is configured to provide routing between at least one or more electrical components while accommodating space limitations, reduced pitches and increased routing density. By way of example, having vias that have an average diameter in a range from about 1 micron to about 500 microns and pitch in a range from about 2 microns to about 1000 microns, enables higher routing density and connectivity to electronic devices that have contact pads with smaller sizes.

With returning reference to FIGS. 1-12, a structure similar to the structure of the electronic assembly 1200 may be obtained using alternative steps. For example, steps represented by FIGS. 9-11 may be replaced by steps illustrated in FIGS. 14-18 to fabricate an electronic assembly 1900 (see FIG. 19) that is similar in physical structure and function to the electronic assembly 1200. Alternatively, steps represented by FIGS. 9-11 may be replaced by steps illustrated in FIGS. 20-24 to obtain an electronic assembly 2500 (see FIG. 25) that is similar in structure to the electronic assembly 1200.

Figure 14:
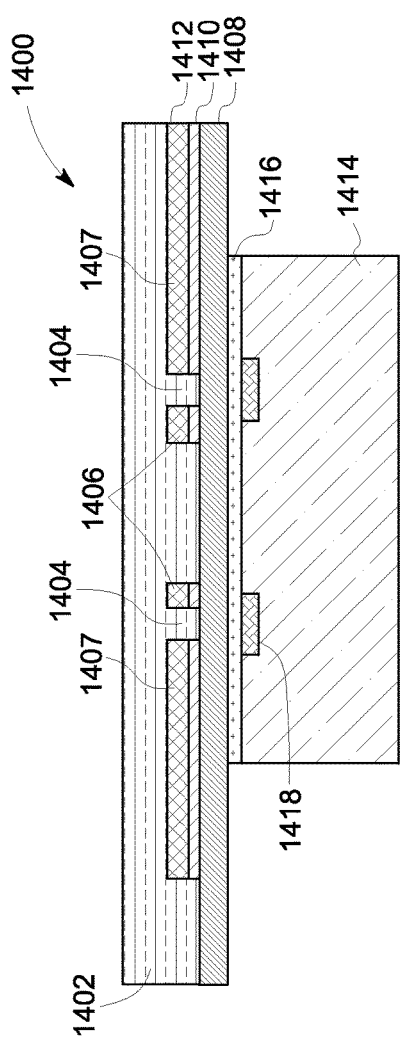
Figure 15:
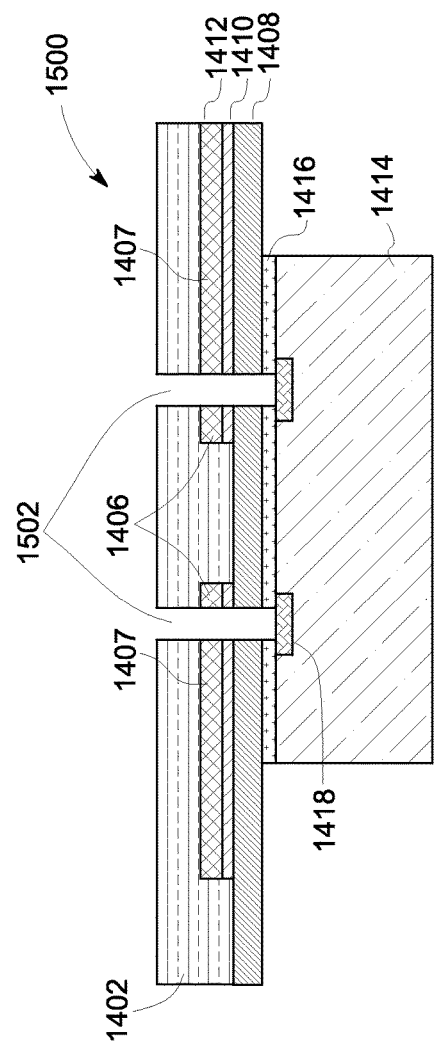
Figure 22:
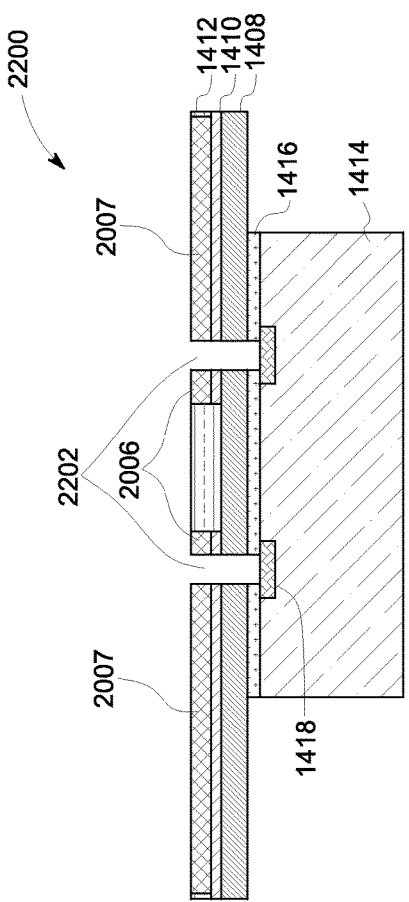

Turning now to FIGS. 14-19, schematic representation 1400 of FIG. 14 illustrates a substrate 1408 having a seed layer 1410 and a metal built-up layer 1412 disposed thereon. Further, an electronic device 1414 is coupled to the substrate 1408 using an adhesive layer 1416 and contact pads 1418. Moreover, a dielectric material 1402 is disposed on at least a portion of the intermediate structure 1400. In particular, the dielectric material 1402 is disposed on exposed surfaces of the metal built-up layer 1412. In one embodiment, the dielectric material 1402 may also be disposed in the pre-defined via locations 1404. Moreover, the dielectric material 1402 may be present between two or more adjacently disposed pre-defined via patterns 1406, or adjacently disposed pre-defined trace patterns 1407, or adjacently disposed pre-defined via and trace patterns 1406 and 1407. Advantageously, the presence of the dielectric material 1402 between the pre-defined via and/or trace patterns 1406 and 1407 may be useful in preventing accidental electrical shorting of the pre-defined via and/or trace patterns 1406 and 1407 during metallization of the vias. Non-limiting examples of such dielectric materials may include polymeric resists, polymer coatings, organic oxides, inorganic oxides, or both. Next, as illustrated in schematic representation 1500 of FIG. 15, the dielectric material 1402 is removed from via locations 1502 corresponding to the via locations 1404 (see FIG. 14) of corresponding pre-defined via patterns 1406. In a non-limiting example, the dielectric material 1402 may be removed from the via locations 1502 using laser patterning, etching, ablation, drilling, or combinations thereof.

Further, as illustrated in the schematic representation 1600 of FIG. 16, a layer 1602 similar to the first conductive layer 152 (see FIG. 10) may be disposed on the dielectric material 1402 and at least in portions of the locations 1502 to provide metallization to at least a portion of the via locations 1404 (see FIG. 14). In one embodiment, the metallization may be performed using sputtering or evaporation. Further, the metallization process may be performed using electro-less or electrolytic plating. In one example, the first conductive layer 1602 may include titanium, copper, or both and may act as a seed layer for a subsequent layer.

Moreover, as represented in the schematic representation 1700 of FIG. 17, a second conductive layer 1702 may be deposited on the first conductive layer 1602. In one example, the first conductive layer 1602 may be configured to act as a seed layer to facilitate deposition of one or more subsequent conductive layers, such as the second conductive layer 1702. In one example, the second conductive layer 1702 may be used to fill the locations 1502 having the first conductive layer 1602. Further, the second conductive layer 1702 may be electroplated using the first conductive layer 1602 that acts as the seed layer for electroplating of the second conductive layer 1702. In some embodiments, the second conductive layer 1702 may be deposited in the locations 1502 using semi-additive plating or preferential deposition. In some other embodiments, the second conductive layer 1702 may be deposited using electroplating, electro-less plating, or combinations thereof.

Further, as illustrated in the schematic representation 1800 of FIG. 18, portions of the first and second conductive layers 1602 and 1702 disposed outside the via locations 1502 may be removed, for example, by etching. It may be noted that the etching may be performed to preferentially remove material of the first and second conductive layers 1602 and 1702 disposed outside the via locations 1502 to define vias 1802 and via and trace patterns 1406 and 1407. Further, remaining portions of the dielectric material 1402 may be removed. The schematic representation 1900 of FIG. 19 illustrates the resultant electronic assembly of the present specification formed by using the steps illustrated in FIGS. 1-8 and 14-18.

FIGS. 20-25 represent exemplary method steps that may be used as alternative method steps to the steps represented by FIGS. 14-19. As illustrated in the schematic representation 2000 of FIG. 20, after coupling the electronic device 1414 to at least a portion of the substrate 1408, a dielectric material 2002 may be disposed on at least a portion of the assembly 2000. In particular, the dielectric material 2002 may be disposed on exposed surfaces of the metal built-up layer 1412, in via locations 2004, and on or between adjacently disposed pre-defined via and trace patterns 2006 and 2007. In one embodiment, the dielectric material 2002 may be a photoresist layer. Further, as illustrated in the schematic representation 2100 of FIG. 21, the dielectric material 2002 may be selectively removed so as to expose the underlying metal built-up layer 1412. In particular, the dielectric material 2002 may be retained between the via and trace patterns 2006 and 2007. Next, as illustrated in the schematic representation 2200 of FIG. 22, the dielectric material 2002 may be removed from via locations 2004 in the via patterns 2006 using techniques, such as, but not limited to, laser patterning, etching, ablation, drilling, or combinations thereof. In addition, the dielectric material 2002 may be removed from the via locations 2004 to form via locations 2202. Further, portions of the metal built-up layer 1412, the seed metal layer 1410, and the substrate 1408 may be removed to form the via locations 2202.

Figure 23:
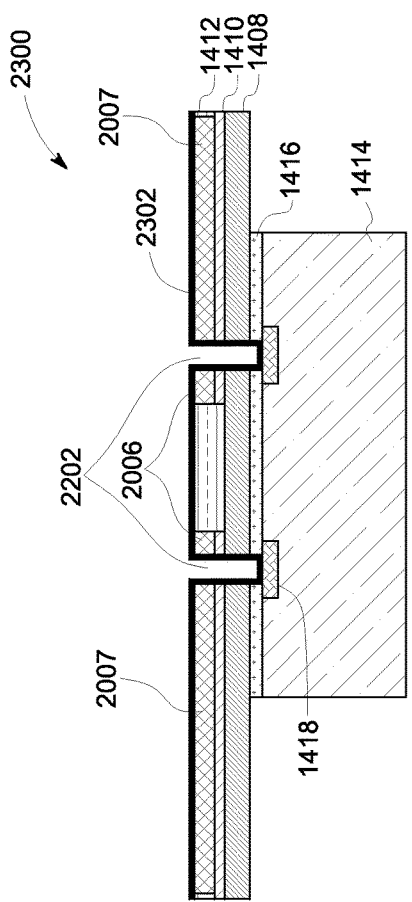
Figure 26:
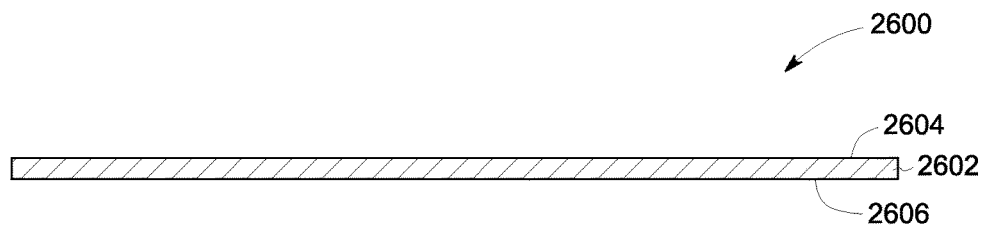
Figure 27:
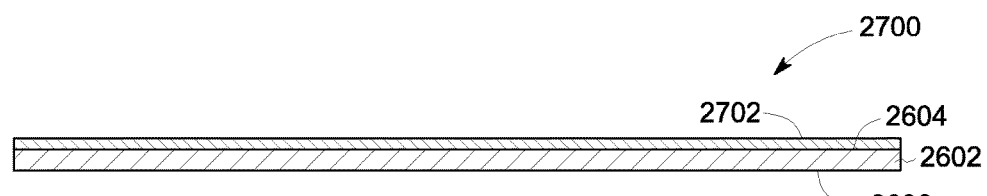
Figure 28:
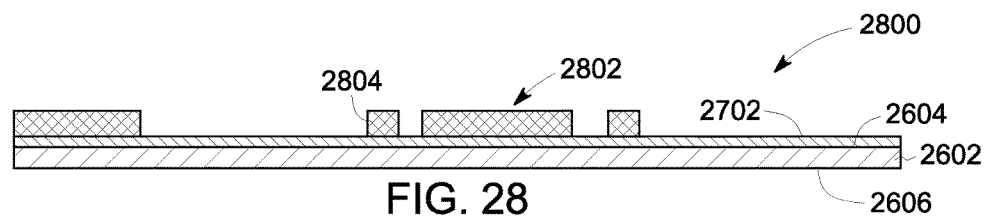

Moreover, as illustrated in the schematic representation 2300 of FIG. 23, a first conductive layer 2302 may be disposed in the via locations 2202 and/or on the portions of the via and trace patterns 2006 and 2007. Next, as illustrated in FIG. 24, a second conductive layer 2402 may be disposed on the first conductive layer 2302. The second conductive layer 2402 is used to fill the locations 2202 to form vias 2502. FIG. 25 illustrates resultant electronic assembly 2500 having vias 2502 and via and trace patterns 2006 and 2007.

FIGS. 26-38 represent an alternative method of making an electronic assembly, such as an electronic assembly 3800 (see FIG. 38), of the present specification. As represented in the schematic representation 2600 of FIG. 26, a substrate 2602 is provided. The substrate 2602 has a first side 2604 and a second side 2606. Further, as illustrated in schematic representation 2700 of FIG. 27, a seed layer 2702 is disposed on the first side 2604 of the substrate 2602. Next, as illustrated in the schematic representation 2800 of FIG. 28, a patterned resist layer 2802 is disposed on portions of the seed layer 2702. The patterned resist layer 2802 may at least include patterns 2804 that may be used to define via locations.

Figure 29:
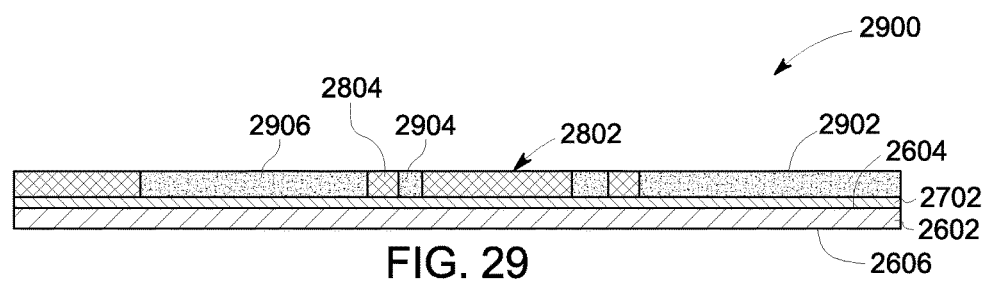

Further, as illustrated in the schematic representation 2900 of FIG. 29, a metal built-up layer 2902 is deposited on the seed layer 2702 such that the metal built-up layer 2902 is disposed between patterns, such as the patterns 2804, of the patterned resist layer 2802. Patterns 2904 of the metal built-up layer 2902 represent at least a portion of pre-defined via patterns, whereas patterns 2906 of the metal built-up layer 2902 represent at least a portion of pre-defined trace patterns.

Figure 30:
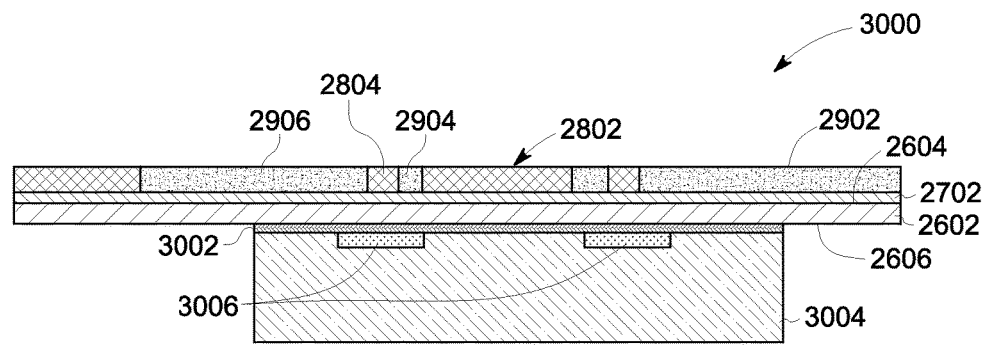

As illustrated in the schematic representation 3000 of FIG. 30, after defining the via locations using patterns 2804 of the patterned resist layer 2802 and after forming the pre-defined via and trace patterns 2904 and 2906 an electronic device, such as an electronic device 3004, may be coupled to the second side 2606 of the substrate 2602. In particular, the electronic device 3004 may be coupled to the second side 2606 of the substrate 2602 using an adhesive layer 3002 such that contact pads 3006 of the electronic device 3004 are aligned with respect to the patterns 2804 of the patterned resist layer 2802. As will be appreciated, these patterns 2804 correspond to via locations in the electronic assembly 3800 (see FIG. 38).

Figure 31:
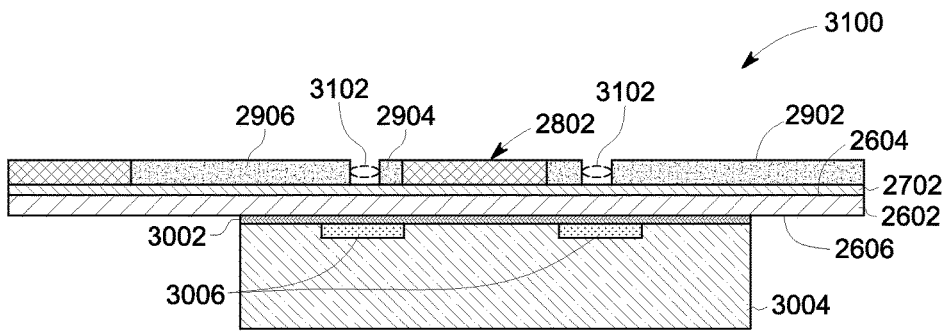
Figure 32:
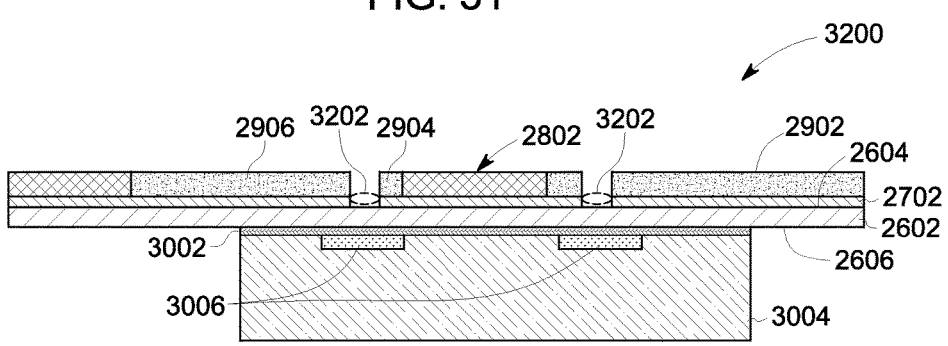
Figure 33:
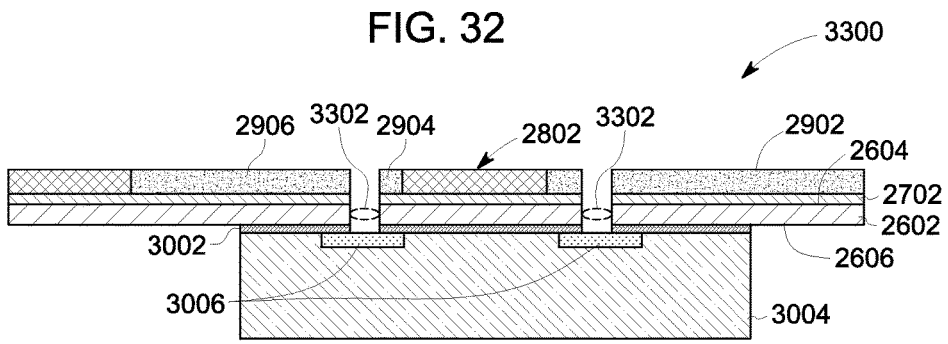

Next, as illustrated in the schematic representation 3100 of FIG. 31, portions 2804 of the patterned resist layer 2802 disposed in locations 3102 may be removed. Subsequently, as represented in schematic representations 3200 and 3300 of FIGS. 32 and 33, respectively, portions 3202 of the seed metal layer 2702 and portions 3302 of the substrate 2602 as well as corresponding portions of the adhesive layer 3002 are removed. In one embodiment, the portions 3102, 3202 and 3302 may be removed using laser ablation, wet etching, dry etching, or combinations thereof.

Figure 34:
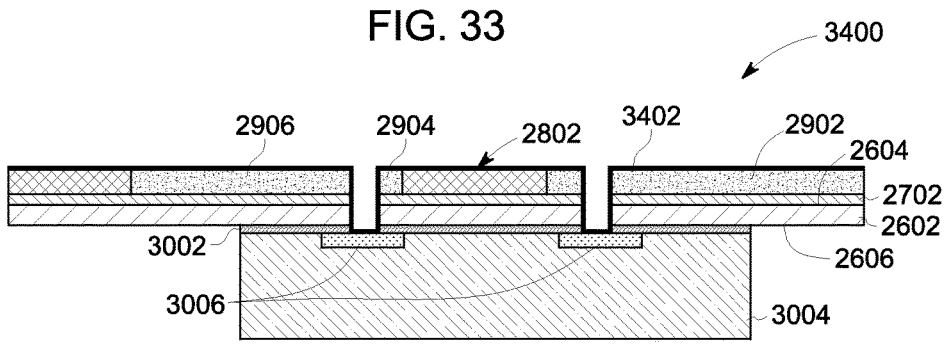
Figure 35:
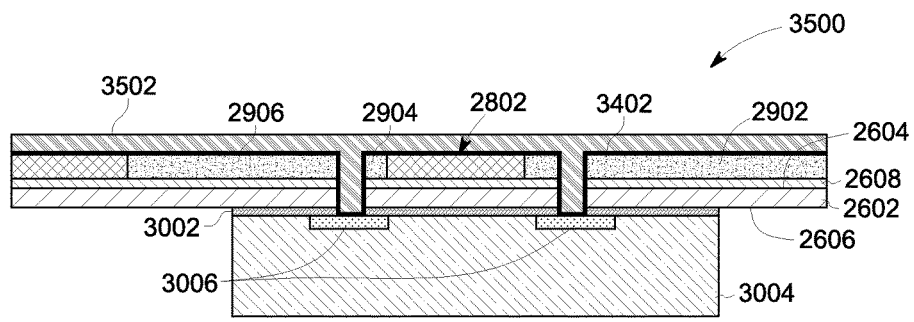

Further, as illustrated in the schematic representation 3400 of FIG. 34, a first conductive layer 3402 is deposited on exposed portions of the patterned resist layer 2802, metal built-up layer 2902 and in the via locations formed in part in the metal built-up layer 2902, the seed metal layer 2702, and the substrate 2602. Next, as illustrated in the schematic representation 3500 of FIG. 35, a second conductive layer 3502 is deposited on the first conductive layer 3402. The first conductive layer 3402 may act as a seed layer for deposition of the second conductive layer 3502. The second conductive layer 3502 is used to fill via locations with the material of the second conductive layer 3502. Accordingly, in some embodiments, the second conductive layer 3502 may be deposited using preferential deposition to ensure that a thickness of the second conductive layer 3502 deposited in the via locations is greater than a thickness of the second conductive layer 3502 deposited elsewhere.

Figure 36:
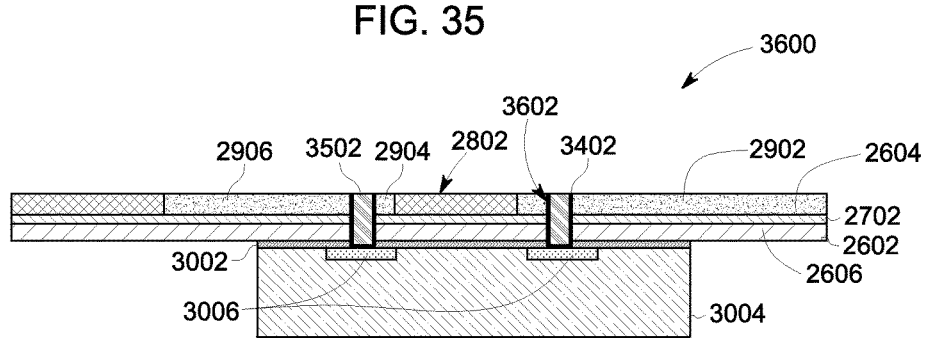
Figure 37:
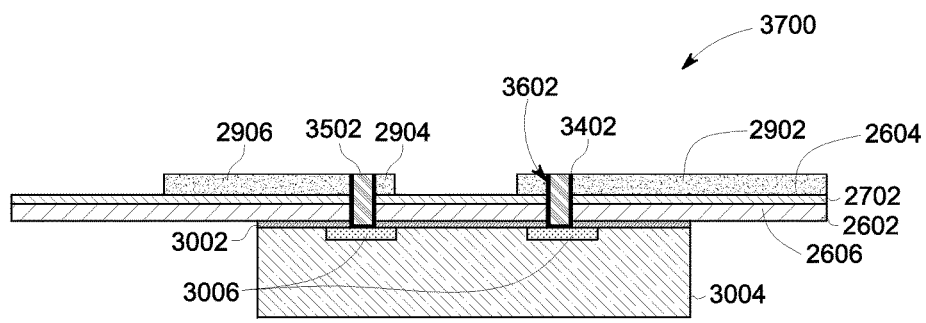
Figure 38:
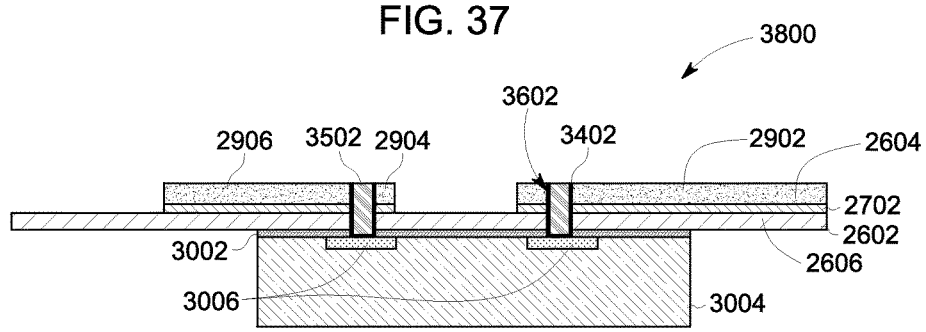

Additionally, as illustrated in the schematic representation 3600 of FIG. 36, the first and second conductive layers 3402 and 3502 may be at least preferentially etched to define vias 3602 at the via locations. Moreover, as illustrated in the schematic representation 3700 of FIG. 37, remaining portions of the patterned resist layer 2802 may be selectively removed. As illustrated in the schematic representation 3800 of FIG. 38, after selectively removing the seed metal layer 2702, an electronic assembly 3800 having vias 3602, and via and trace patterns 2904 and 2906, respectively is formed.

It may be noted that the presence of portions of the patterned resist layer 2802 during deposition of the first and second conductive layers 3402 and 3502 prevents electrical short circuiting between adjacently disposed one or more of vias, via patterns, and trace patterns. Further, after deposition of the first and second conductive layers 3402 and 3502 to form the vias 3602 the remaining portions of the patterned resist layer 2802 may be removed without compromising the integrity of the electronic assembly 3800. In particular, due to the presence of the patterned resist layer 2802, any spillover of the metal during via fill may not result in undesirable connections being formed between the vias 3602 and the adjacent via and trace patterns 2904 and 2906.

It may be noted that the method represented in FIGS. 1-12, 14-19, 20-25, and 26-38 are configured to yield electrically functional modules, however, several other features or add-ons may be desirable to render the electrically functional module, such as the electronic assembly 1200, suitable to be operatively coupled to other electronic devices and/or components. By way of example, it may be desirable to encapsulate the electronic assembly 1200 to provide mechanical rigidity before assembling the electronic assembly 1200 onto a printed circuit board (PCB). Also, although the method represented in FIGS. 1-12, 14-19, 20-25, and 26-38 represent only a first routing layer and may be sufficient for some applications, the method of the present application may be used to form a stacked structure that includes a plurality of additional routing layers or such electronic packages 1200, 1300, 1900, 2500, and 3800. Additionally, other features, such as, solder mask, surface finish layers may be added to the electronic packages of the present application.

Advantageously, the method of the present specification allows the via locations that may result in faulty vias to be inspected and/or tested prior to coupling an electronic device to the substrate. Further, once the defective or faulty via locations are identified, the identified via locations may not be coupled to the electronic device, thereby saving the expensive electronic devices from becoming inoperable due to virtue of them being connected to a resultant faulty via.

While only certain features of the disclosure have been illustrated and described herein, many modifications and changes will occur to those skilled in the art. It is, therefore, to be understood that the appended claims are intended to cover all such modifications and changes as fall within the true spirit of the disclosure.

The invention claimed is:
1. An electronic package, comprising:
 a substrate having a first side and a second side;
 a seed metal layer disposed on at least a portion of the first side of the substrate;
 a patterned resist layer disposed on at least a portion of the seed metal layer, wherein the patterned resist layer and the seed metal layer are at least partly removed exposing the first side of the substrate during formation of the electronic package to define a plurality of pre-defined via locations, a plurality of pre-defined via patterns, and a plurality of pre-defined trace patterns;

a metal built-up layer disposed on at least a portion of the seed metal layer corresponding to the plurality of pre-defined via locations and the plurality of pre-defined trace patterns, the metal built-up layer disposed on at least a portion of the seed metal layer such that the seed metal layer is disposed between the substrate and the metal built-up layer, an adhesive layer disposed on at least a portion of the second side of the substrate;

a contact pad disposed on at least a portion of the adhesive layer and aligned with at least one of the plurality of pre-defined via locations;

an electronic device coupled to the contact pad and aligned with one of the plurality of pre-defined via locations, the plurality of pre-defined via patterns, and the plurality of pre-defined trace patterns, wherein the substrate and the adhesive layer are at least partly removed to extend the plurality of pre-defined via locations to the electronic device;

a first conductive layer disposed on at least a portion of the plurality of pre-defined via locations, the plurality of pre-defined via patterns, and the plurality of pre-defined trace patterns; and a second conductive layer disposed on the first conductive layer such that the second conductive layer is disposed within the plurality of pre-defined via locations, wherein a plurality of vias, a plurality of via patterns and a plurality of trace patterns are formed by selectively removing a portion of the first conductive layer and the second conductive layer disposed outside the plurality of pre-defined via locations, the plurality of pre-defined via patterns and the plurality of pre-defined trace patterns.

2. The electronic package of claim 1, wherein the seed metal layer has a thickness in a range from about 10 nanometers to about 25 microns.

3. The electronic package of claim 1, wherein an average diameter of the plurality of vias is in a range from about 1 micron to about 500 microns.

4. The electronic package of claim 1, wherein an average pitch between two adjacently disposed vias of the plurality of vias is in a range from about 2 microns to about 1000 microns.

5. The electronic package of claim 1, wherein the plurality of vias comprise blind vias, through vias, or a combination thereof.

6. The electronic package of claim 1, wherein one or more of the metal built-up layer, the first conductive layer, and the second conductive layer comprise titanium, tantalum, copper, nickel, gold, silver, chrome, aluminum, titanium-tungsten, or combinations thereof.

7. An electronic assembly, comprising:
an electronic package, wherein the electronic package comprises:
a substrate having a first side and a second side;
a seed metal layer disposed on at least a portion of the first side of the substrate;
a patterned resist layer disposed on at least a portion of the seed metal layer, wherein the patterned resist layer and the seed metal layer are at least partly removed exposing the first side of the substrate during formation of the electronic package to define a plurality of pre-defined via locations, a plurality of pre-defined via patterns, and a plurality of pre-defined trace patterns;

a metal built-up layer disposed on at least a portion of the seed metal layer corresponding to the plurality of pre-defined via locations and the plurality of pre-defined trace patterns, the metal built-up layer disposed on at least a portion of the seed metal layer such that the seed metal layer is disposed between the substrate and the metal built-up layer;

an adhesive layer disposed on at least a portion of the second side of the substrate;

a contact pad disposed on at least a portion of the adhesive layer and aligned with at least one of the plurality of pre-defined via locations, wherein the substrate and the adhesive layer are at least partly removed such that the contact pad is operatively coupled to at least one of the plurality of pre-defined via locations;

an electronic device coupled to the contact pad and aligned with the plurality of pre-defined via locations, the plurality of pre-defined via patterns, and the plurality of pre-defined trace patterns, wherein the substrate and the adhesive layer are at least partly removed to extend the plurality of pre-defined via locations to the electronic device;

a first conductive layer disposed on at least a portion of the metal built-up layer such that the first conductive layer is disposed on at least a portion of the plurality of pre-defined via locations, the plurality of pre-defined via patterns, and the plurality of pre-defined trace patterns; and a second conductive layer disposed on the first conductive layer such that the second conductive layer is disposed within the plurality of pre-defined via locations, wherein a plurality of vias, a plurality of via patterns and a plurality of trace patterns are formed by selectively removing a portion of the first conductive layer and the second conductive layer disposed outside the plurality of pre-defined via locations, the plurality of pre-defined via patterns and the plurality of pre-defined trace patterns, and wherein an average width of the pre-defined trace patterns is in a range from about 1 micron to about 1000 microns.

8. The electronic assembly of claim 7, wherein the electronic device is coupled to the pre-defined via patterns.

9. The electronic assembly of claim 7, wherein the plurality of vias is blind vias.

10. The electronic assembly of claim 7, wherein the electronic package further comprises a semiconductor die.

11. The electronic assembly of claim 7, wherein an average diameter of the vias of the plurality of vias is in a range from about 1 micron to about 500 microns.

12. The electronic assembly of claim 7, wherein an average pitch between two adjacently disposed vias of the plurality of vias is in a range from about 2 microns to about 1000 microns.

* * * * *